United States Patent [19]

Blake et al.

[11] Patent Number: 5,055,669
[45] Date of Patent: Oct. 8, 1991

[54] CONSTANT-CURRENT LIGHT-SENSING SYSTEM

[75] Inventors: Frederick H. Blake, Mill Creek; C. David Long, Redmond, both of Wash.

[73] Assignee: Multipoint Control Systems, Everett, Wash.

[21] Appl. No.: 554,176

[22] Filed: Jul. 16, 1990

Related U.S. Application Data

[63] Continuation-in-part of Ser. No. 375,932, Jun. 29, 1989, abandoned.

[51] Int. Cl.⁵ .............................................. H01J 40/14
[52] U.S. Cl. ............................... 250/214 AL; 307/311
[58] Field of Search ........ 250/214 AL, 214 R, 214 B; 315/149, 156; 307/311

[56] References Cited

U.S. PATENT DOCUMENTS

| 3,056,332 | 10/1962 | Beregowitz | 250/214 R |
| 3,421,008 | 1/1969 | Shaw | 250/214 R |
| 3,665,224 | 5/1972 | Kelsey | 250/214 AL |
| 4,585,339 | 8/1986 | Senoo | 250/214 AL |
| 4,758,767 | 7/1988 | Blake | 315/158 |
| 4,841,164 | 6/1989 | Basso | 250/214 AL |

OTHER PUBLICATIONS

Horowitz, Paul and Winifield Hill, *The Art of Electronics*, Cambridge University Press, 1980, pp. 595-596, 231-232.

Primary Examiner—David C. Nelms
Attorney, Agent, or Firm—Bruce A. Kaser

[57] ABSTRACT

A constant-current light sensing system employs a constant-current diode in series with the power lead to a photoconductive cell. This diode provides a substantially fixed current through the cell and enables the system to be designed such that it can make maximum use of the linear portions of the cell's output response curve, and maximum use of the range of a potentiometer's settings. The cell used in conjunction with the system is received in a housing that is easily mountable to a wall or ceiling surface by an adhesive material.

11 Claims, 9 Drawing Sheets

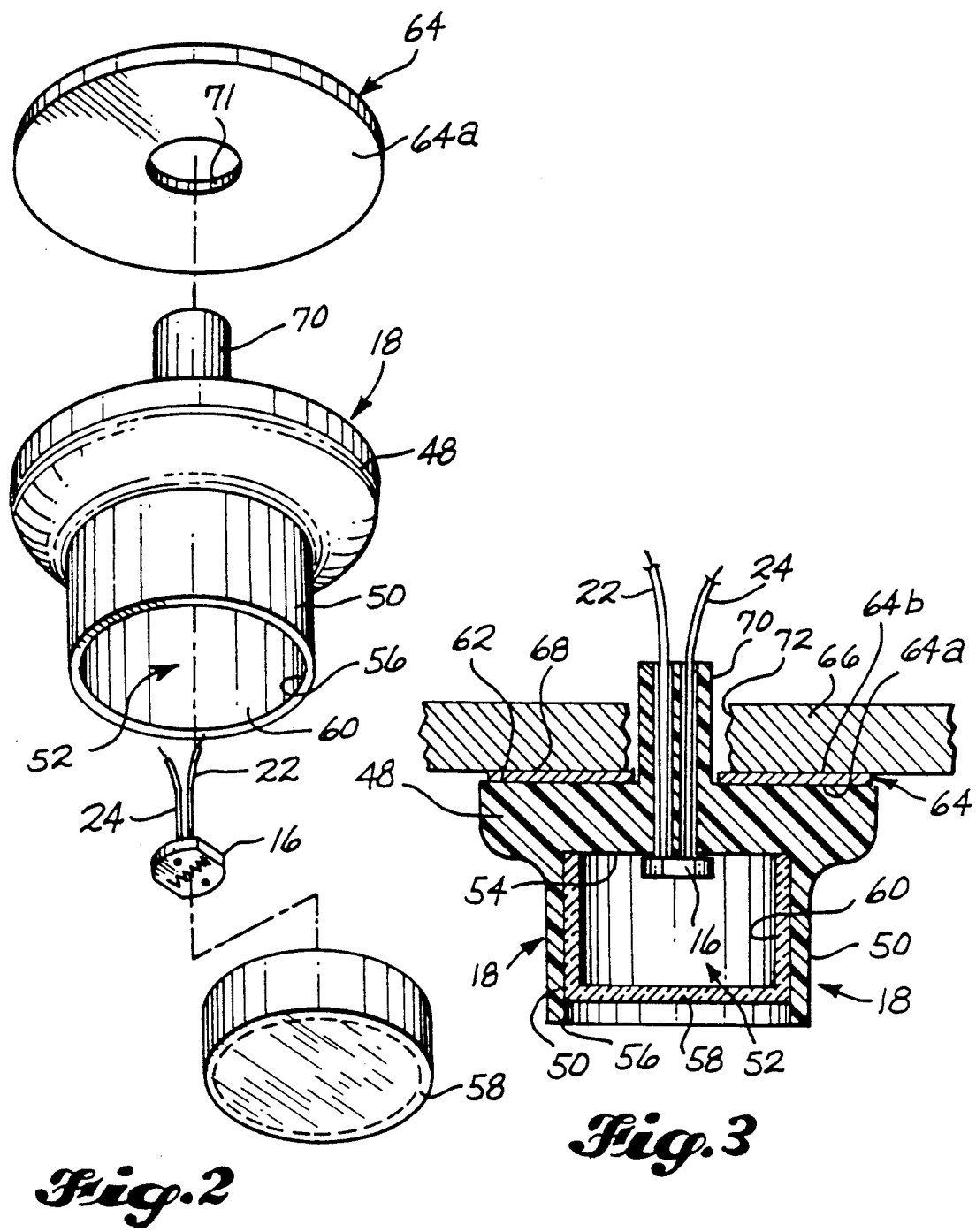

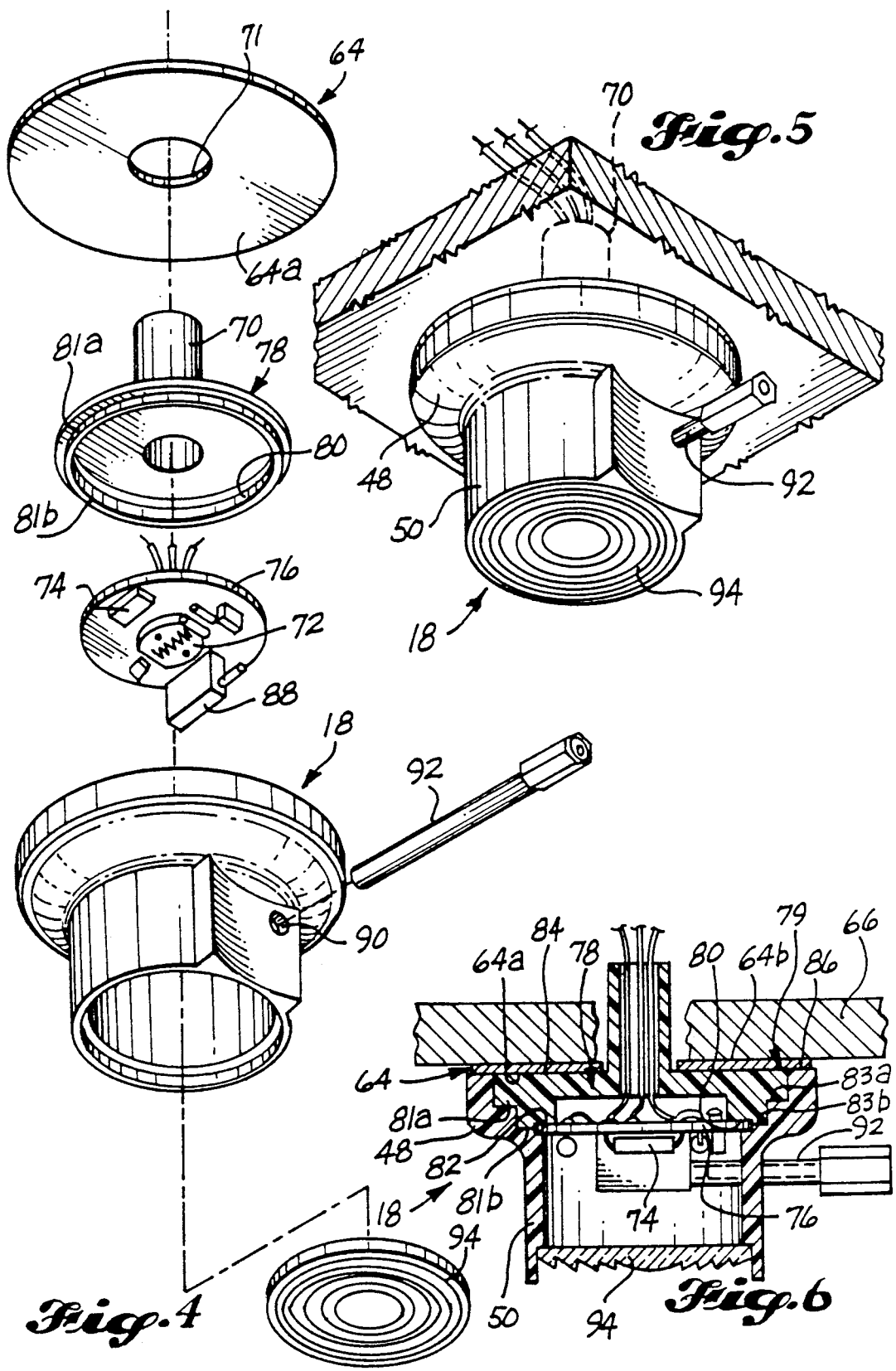

AJUST. POTENTIOMETER MOTION

| FOOT CDLS. | VOLTAGE INPUT | DEGREE OF ADJ. OF POT | NOTE: |
|---|---|---|---|
| 1 | 7.5 | 120 DEG. | NOTE: ZERO TO 120 DEGREE RANGE OF POTENTIOMETER IS WASTED IN DROPPING FROM 12 VDC TO 7.5 VDC. |
| 2 | 6.0 | 135 DEG. | |
| 5 | 4.9 | 160 DEG. | |
| 10 | 3.4 | 194 DEG. | |
| 20 | 2.0 | 225 DEG. | |
| 50 | 0.52 | 258 DEG. | |
| 100 | 0.34 | 263 DEG. | |
| 200 | 0.21 | 265 DEG. | |
| 400 | 0.12 | 267 DEG. | |
| 500 | 0.10 | 267.5 DEG. | |

CONSTANT-CURRENT LIGHT-SENSING SYSTEM

This application is a continuation-in-part of U.S. application Ser. No. 375,932 filed June 29, 1989, now abandoned.

TECHNICAL FIELD

This invention relates to light sensors which control artificial lights in indoor and outdoor areas depending on the level of natural light available in such areas. In particular, the invention relates to sensors of this type which employ photoconductive cells.

BACKGROUND INFORMATION

There are typically two kinds of light sensors or light-sensing heads currently in use in the light control industry. One is a photodiode type sensor employing a photocell that outputs a proportional varying voltage depending on the amount of light impinging on the cell. The other is a photoconductive sensor employing a cell whose resistance changes as the light on the cell varies. Either type is usable in many of the same situations. However, a well-designed photodiode sensor can output an extremely accurate analog signal that is compatible for input to computer controls. A good example of this is the sensor disclosed in U.S. Pat. No. 4,758,767 which was designed by Fred Blake, one of the inventors of the invention disclosed herein. The photoconductive type, on the other hand, cannot match the accuracy of the photodiode type but nevertheless is adequate for use in many light control systems with good results. Although less accurate, the advantage of the photoconductive type over the photodiode type is that the photoconductive type is cheaper. The invention of the present case relates to photoconductive type sensors, although it includes an improved housing design which could be easily implemented with either a photodiode or photoconductive type indoor sensor.

The typical photoconductive cell sensor is a two-lead system where the cell is connected to control circuitry. Usually, the cell is remotely located from the control circuitry. In some situations, however, both the cell and circuitry reside in the same housing.

One of the cell's leads is grounded while the other is connected to a low-voltage power source (typically 12 VDC) through a load limiting resistor. Typically, the control circuitry processes the cell's output, which is a change in resistance varying with light input that is "read" as a voltage change. The control circuitry has a comparator circuit that monitors this and outputs an "on" or "off" signal depending on the cell's output.

Referring to FIG. 11, for example, a conventional control circuit for a photoconductive type sensor is illustrated there. This particular configuration utilizes a high-resistance photoconductive cell 1 having a resistance of approximately 1000K ohms at 2 foot candles input, and 10K ohms at 500 foot candles input. The control circuit 2 utilizes a current limiting resistor 3 between a low-voltage power source 4 (12 volts DC) and circuit junction 5. The control circuit 2 has conventional sensor delay circuitry, indicated generally at 6, and conventional buffer circuitry, indicated generally at 7. The total range of output from the buffer 7 with the circuitry as shown is approximately 6 to 7.5 volts DC for 2 foot candles and approximately 0.1 volts DC for 500 foot candles.

The photoconductive cell 1 illustrated in FIG. 11 is a standard wide range type and, as the skilled person would know, its output is nonlinear. As the skilled person would also know, when it is used in conjunction with the circuitry of FIG. 11, approximately 90% of its voltage output response is used up in the first 10% of the input to the cell, which is approximately 0 to 50 foot candles. The remaining 10% of the voltage output range is available for the last 90% of the light level range, i.e. 50 to 500 foot candles. This is illustrated in the two left-handed columns of FIG. 14.

Referring again to FIG. 11, the circuitry shown there also has an operational amplifier circuit 8 that is used as a voltage comparator, and outputs an "on" or "off" signal, depending on the relative setting of a potentiometer indicated schematically at 9. This signal triggers one or more relays which correspondingly turn on or shut off artificial lights.

The kind of potentiometer used in the above-described circuitry is a type whose voltage input is adjusted by turning the potentiometer. FIG. 14 shows how the voltage input varies with the degree of potentiometer adjustment. Although not shown on the table, the 0° position corresponds to approximately 12 volts and the input approaches zero by the time the potentiometer is turned to approximately the 270° position.

In the FIG. 11 circuit, since the upper limit of output from buffer 7 is approximately 6 to 7.5 volts DC, any potentiometer settings in the 12 to 7.5 volt range (0 to 120° of turning motion) are not usable and are therefore wasted. This is illustrated, for example, in FIG. 15. Even worse, and as FIGS. 14 and 15 show, most of the potentiometer's remaining settings are used up within a small range of 1 to 100 foot candles input to the photocell.

Although the potentiometer is relatively easy to set in this range, due to the action of the current-limiting resistor 5 in the configuration of FIG. 11, this usable portion is not linearly proportional because the voltage read by the potentiometer follows the nonlinear output of the photocell. This is illustrated in FIG. 15 by that portion of the curve identified by the words "Easy Setting Range." As the table of FIG. 14 shows, above 100 foot candles use of the potentiometer is made extremely difficult. The invention disclosed herein, among other things, provides a way to make nearly full use of the range of potentiometer motion, and makes the scale of the potentiometer more uniform or, in other words, more linear. It therefore makes for an easier, more accurate-to-adjust system. This will become better understood upon consideration of the description which follows, and the drawings.

Further, inside ceiling-type sensor housings of the type which house either photoconductive or photodiode cells have, in the past, been bulky and relatively problematic in their installation. Referring to FIGS. 12 and 13, for example, the sensor housing shown there is typical to the current field. In order to install this housing, the housing's body 11 first requires that a circular hole be cut in a ceiling tile (not shown) where the sensor is to be installed. Then, a clamping ring 12 is positioned behind the hole, and the body 11 is inserted therethrough. The sensor's face plate 13 is screwed directly to the clamping ring as shown at 14 and sandwiches the ceiling tile in between. A significant amount of labor is required to make this installation. As will become apparent from considering the following description when taken in conjunction with the drawings, the inside ceiling sensor housing disclosed herein is of a superior design. Not only is it much easier to install than previous designs, but its smaller size is less obtrusive to the eye.

SUMMARY OF THE INVENTION

The invention disclosed herein is an improved constant-current light-sensing system which improves the accuracy of a photoconductive type light sensor. A photoconductive cell is received in a housing and has two leads, one that is grounded and the other which is connected to a circuit junction that further connects the cell to control circuitry. The cell in its housing is usually remotely mounted relative to the control circuitry and the junction. A low voltage power source is connected to the junction by means of a constant current diode. This diode controls the current at a constant value from the power source to the junction and provides greater use of a potentiometer's range—almost full range instead of the limitations previously described.

Use of the constant-current diode results in the current through the photoconductive cell being substantially constant because the control circuitry draws very little current. By selectively using certain cells having known ranges of resistance changes, in combination with selective use of constant-current diodes, it is possible to make use of only the substantially linear portions of a photoconductive cell's output. This will become better understood later.

The cell is received in a housing that is easily mountable to either a wall or ceiling surface, although it is typically mounted to ceiling surfaces only. The housing has a base portion which flares radially outwardly from one end of a body portion. The body portion defines a chamber in which the cell is received, and has a light-transparent opening. This opening receives light from an area forwardly of the sensor housing which impinges on the cell. On the back of the base portion is a circular mounting surface to which is attached an adhesive material. The housing is easily installed by simply removing the backing from the adhesive and sticking it to the ceiling. The housing therefore requires only a small hole behind its mounting surface for wiring installation.

BRIEF DESCRIPTION OF THE DRAWINGS

In the drawings, like reference numerals and letters refer to like parts throughout the various views except where otherwise indicated, and wherein:

FIG. 2 is an exploded view of an improved sensor housing which receives a photoconductive cell making up part of the system shown in FIG. 1;

FIG. 3 is a side cross-sectional view of the housing shown in FIG. 2;

FIG. 4 is a view like FIG. 2, but shows an alternative housing design which is suitable for use in conjunction with a photodiode type light sensor;

FIG. 5 is a pictorial view of the sensor embodiment shown in FIG. 4;

FIG. 6 is a cross-sectional view of the sensor embodiment shown in FIGS. 4 and 5

BEST MODE FOR CARRYING OUT THE INVENTION

Figure 1:
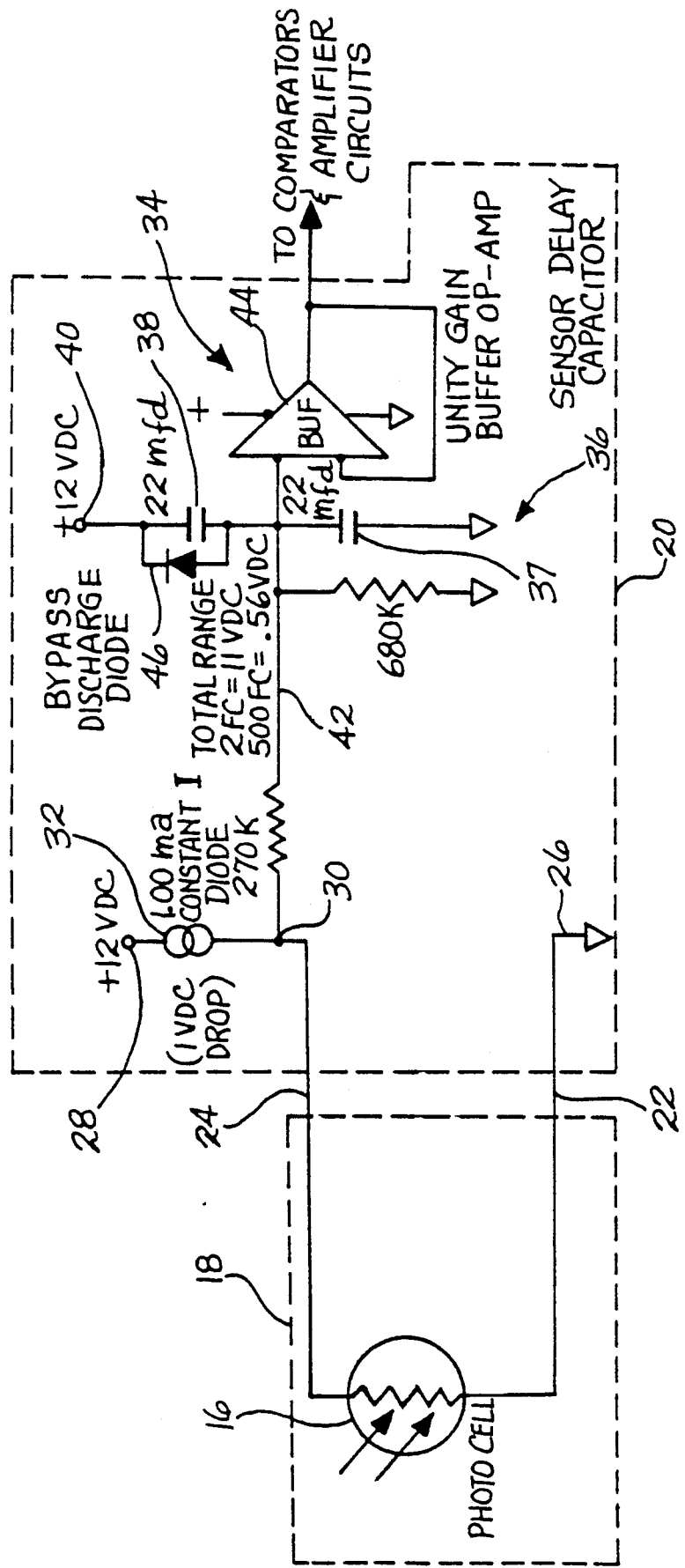
FIG. 1 is an electrical schematic showing a constant-current light sensing system in accordance with the invention.
Figure 7:
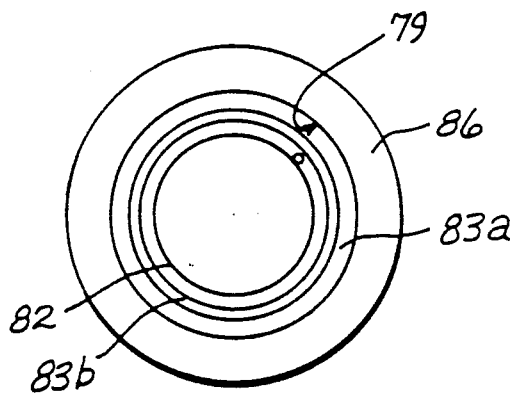
FIG. 7 is a rear view of the housing shown in FIG. 4, but with its circuit board, back-end plug and adhesive material removed.
Figure 8:
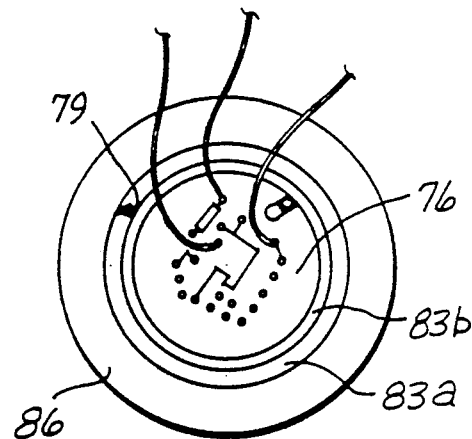
FIG. 8 is a view like FIG. 7, but shows the sensor housing and its circuit board.
Figure 9:
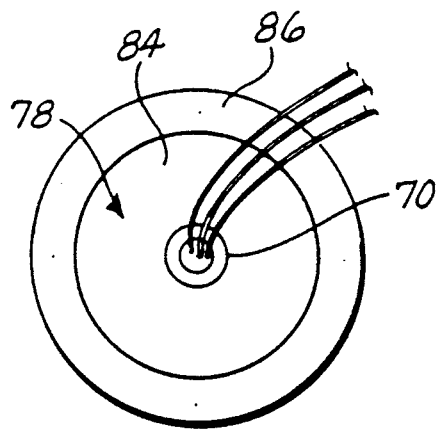
FIG. 9 is a view like FIGS. 7 and 8, but shows the back-end plug installed in the housing.
Figure 10:
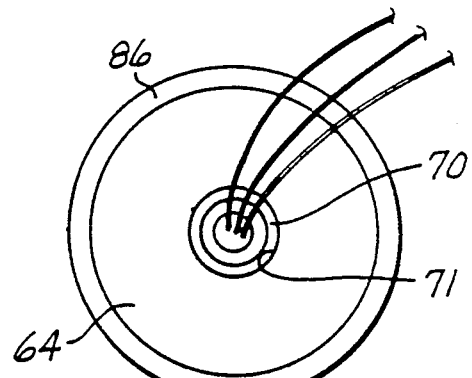
FIG. 10 is a view like FIGS. 7-9, but shows the adhesive material attached to the back of the housing and plug.

Referring now to FIG. 1, therein is shown at 16 a photoconductive cell received in a housing that is schematically indicated by dashed lines 18. The housing 18, which is further described later, is usually remotely located from system control circuitry, the latter being schematically indicated by dashed lines 20. In some situations, of course, the cell and control circuitry could be enclosed in the same housing. This is not shown here, however.

The terminology "remotely located" as used herein should be taken to mean that the photoconductive cell 16 may be located many feet (10 to 30 feet, by way of nonlimiting example) from the system control circuitry 20.

The cell 16 has two leads 22, 24. One is grounded as indicated at 26, and the other is connected to a conventional 12 volt DC power source 28. Serially interconnecting the power supply 28 and a circuit junction 30 is a constant-current diode 32. The power supply 28 and diode 32 function as a constant current source. The diode 32 is a known electrical circuit element of a type that preferably transmits a constant current of approximately 1.0 milliamps through it from the power supply 28, so long as the voltage drop across the diode 32 exceeds approximately 1 volt DC.

While the sensor circuit of FIG. 1 is in operation, the sum of the voltage across photocell 16 and across constant-current diode 32 equals the fixed-voltage of the 12 volt DC power supply 28. In other words, and for the sake of illustration only, if the voltage across photocell 16 is 7 volts DC. the voltage drop across diode 32 must be 5 volts DC. By way of further example, as the voltage across the cell 16 varies between approximately 1 volt DC to 11 DC, the voltage across diode 32 correspondingly varies between approximately 11 volts DC to 1 volt DC, bu the diode 32 continually transmits approximately 1 milliamp.

However, when the voltage across diode 32 drips to approximately 1 volt DC, it then functions to transmit a variable current. In such situation, the current transmitted by the diode 32 then varies proportionately to the resistance of the cell 16, so long as the resistance of cell 16 meets or exceeds a certain desired maximum resistance of 11K ohms (corresponding to 11 volts DC, i.e., 11 volts = 1 milliamps × 11K ohms).

So long as cell resistance remains at or above such level (11K ohms), the voltage across the diode 32 remains at approximately 1 volt, and does not drop significantly lower although, as just mentioned, the current through the diode varies. This limits the voltage across cell 16 to 11 volts, regardless of how high its resistance above 11K ohms, meaning the cell 16 is essentially nonresponsive to light levels that are at or below a certain threshold level corresponding to 11K ohms of resistance.

A buffer circuit, indicated generally at 34, senses the voltage across junction 30. This corresponds to the cell's changing resistance multiplied by the constant 1.0 milliamps provided through diode 32 (V = IR).

Most of the diode's constant current passes through the cell 16 because the resistances in the control circuit 20 are significantly higher than even the highest resistance of the cell. In fact, the control circuit 20 draws substantially no current except when there is a voltage shift. Therefore, the photocell's current is, for all practical purposes, the same as the diode's. The voltage at junction 30 varies, of course, depending on the amount of light impinging on the cell in correspondence to the cell's changing resistance.

The buffer circuit 34 has a unity gain buffer 44 and a conventional sensor delay circuit, indicated generally at 36. This circuit 36 has a large capacitance capacitor 37 (22 microfarad) which slows down the response of the control circuitry 20 to rapid changes in light on the cell 16. Unlike conventional designs, a large capacitance (22 mfd.) capacitor 38 connects a 12 volt DC power source 40 to the input of buffer circuit 34, or in other words, to the line 42 which interconnects circuit junction 30 and the unity gain buffer 44. Also, unlike conventional designs, a discharge diode 46 is used as a uni-directional bypass bridging around compacitor 38.

The use of the large capacitor 38 in series with the 12 volt DC input accomplishes a needed function when photocell light controls are turned off when not in use. This is generally the case when the photocell light controls are powered from the downstream side by a separate occupancy sensor lighting control system (not shown here). In the usual conventional circuit, such as the circuit shown in FIG. 11, for example, a small but "fast" capacitor is generally used to filter noise from the 12 volt input to the buffer circuit. This capacitor is indicated at 45 in FIG. 11. Capacitor 45 may have a capacitance of only 0.1 mfd., for example, and therefore has no impact on charging the delay capacitor 47 of sensor delay circuit 6. When such a unit is turned off every time an occupancy sensor turns off the power, and when the power goes on again, such as when somebody enters a room at night, the voltage output read from the photocell 1 in the sensor is high, but the delay capacitor 47 may be uncharged. Therefore, the input to the operational amplifier of buffer 7 starts out low until capacitor 47 charges, thus leaving the lights turned off for a period of time. By way of illustration, it takes approximately a minute for the delay capacitor 47 of the FIG. 11 control circuit to charge and subsequently cause buffer and comparator circuits 7, 8 to turn on the lights. This is bothersome to the occupant of the room as he or she immediately thinks there is something wrong with the light control system. Placing a 22 mfd. capacitor (same as the sensor delay capacitor) in series with the 12 volt DC input to buffer circuit 34 causes the delay capacitor to be immediately "forced" to approximately 6 volts DC and the lights come on immediately.

As the input to the buffer 34 stabilizes, the voltage follows that of the photocell's output. When an occupancy sensor subsequently turns off the lights (and the photocell control), it is necessary to "clamp off" the capacitor 38 and drain its charge. This is accomplished by the clamping diode 46 around capacitor 38 which prevents any harm to the components making up circuitry 20 that might be caused by a residual charge in capacitor 38.

Figure 11:
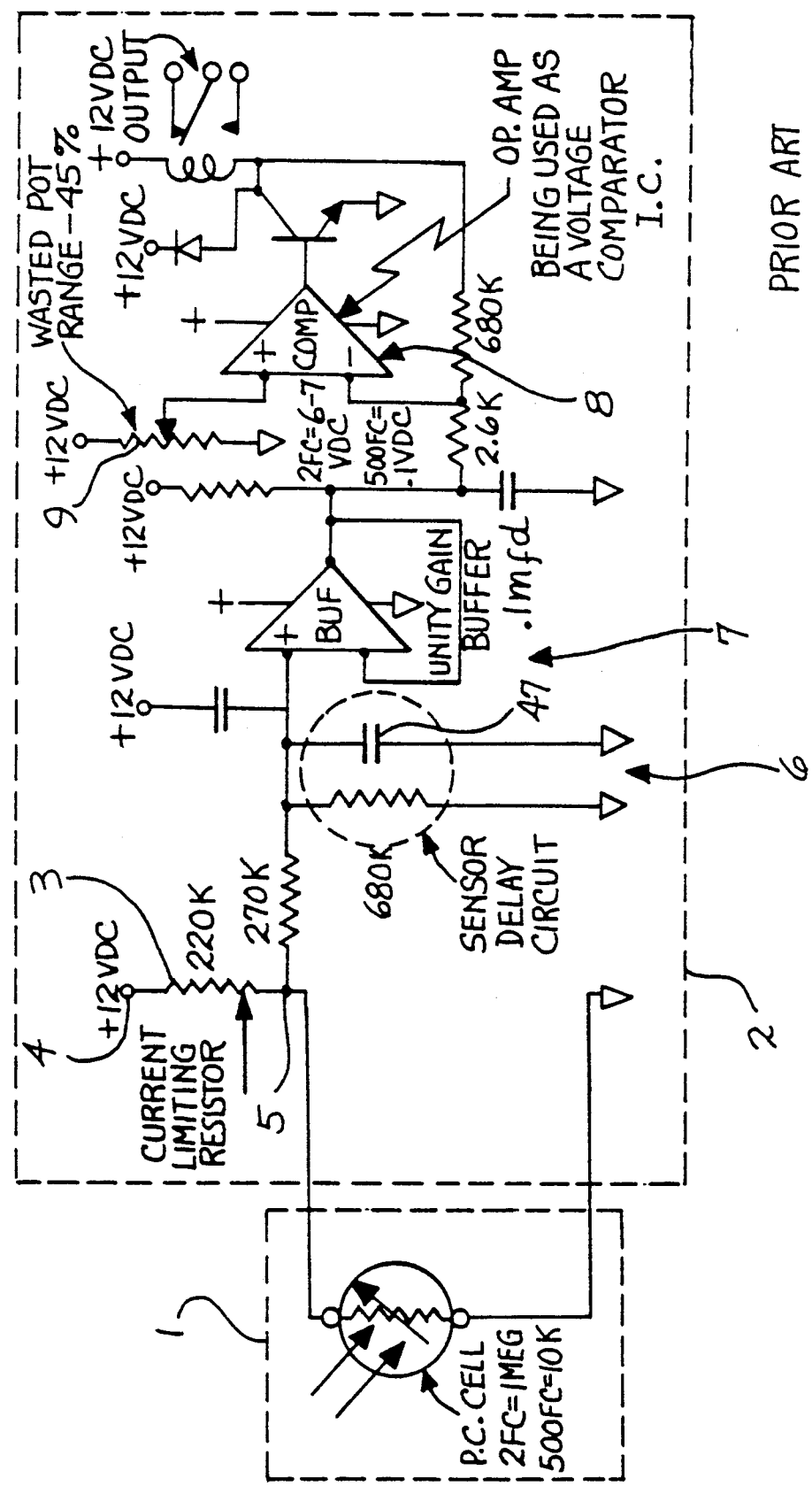
FIG. 11 is an electrical schematic labeled "prior art" and shows the old way of using a photoconductive cell in a light control system.

With the exception of diode 46 and capacitor 38, the buffer circuitry 34 of FIG. 1 functions similarly to the buffer circuitry 7 of FIG. 11. This circuitry outputs a signal indicative of the voltage across circuit junction 30 to a conventional 12 volt comparator and amplifier circuit which is the same or similar to the circuitry 8 shown in FIG. 11. As is well known, the comparator circuitry is of a type having a potentiometer that controls the set-point for the comparator.

As would be familiar to a person skilled in the art, photoconductive cells may be designed to have lower or greater resistances. In the system shown in FIG. 1, the use of the constant-current diode 32 permits use of different resistances in the photocell while still obtaining output characteristics that start the sensing point at other than zero light. For example, one type of known photoconductive cell that could be used in the FIG. 1 system has 11K (ohms resistance at two foot candles of light input, and approximately 1.5 K at 50 foot candles (see FIG. 16). When this cell receives 2 foot candles, the input to the buffer circuit 34 is approximately 11 volts DC. When the input is 50 foot candles, the voltage drops to approximately 1.5 volts DC. This enables use of approximately 87.5% of the full range of a conventional 12 volt potentiometer in .a comparator circuit, and also provides mostly linearly proportional adjustment because it takes advantage of only a portion of the cell's output response, and such portion is substantially linear. This is indicated by arrow 51 in FIG. 16.

Figure 17:
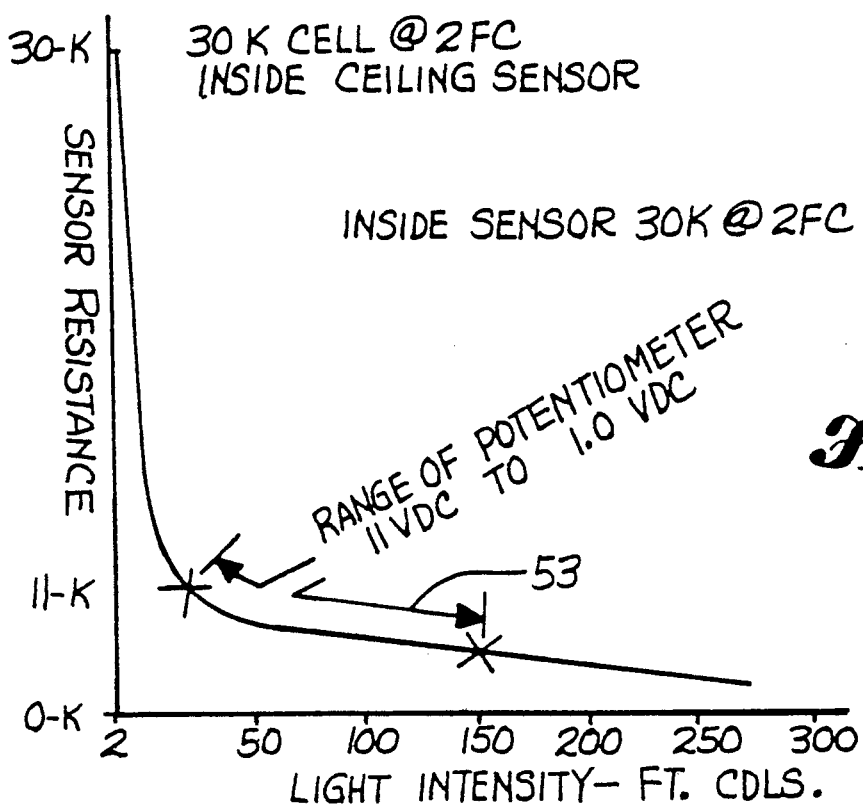
FIG. 17 is a view like FIG. 15, but is for a photocell having intermediate resistance.

Certain higher resistance cells may have 30K resistance at 2 foot candles, 11K resistance at 25 foot candles, and its resistance further drops to approximately 1K at 150 foot candles see FIG. 17). When using this cell in conjunction with the circuitry shown in FIG. 1, the buffer 34 receives 1 volts DC until the foot candle input is approximately 25 foot candles, at which point the resistance of the cell has been reduced to approximately 11K. In other words, the circuit is nonresponsive to changes between 2 and 25 foot candles. Thereafter, between the 25 foot candle and 150 foot candle range, the voltage to the buffer circuit, and consequently to the potentiometer, will vary approximately linearly from 11 volts DC to approximately 1 volt DC. This is indicated at 53 in FIG. 17. Once again, almost all of the range of the potentiometer is usable.

Figure 18:
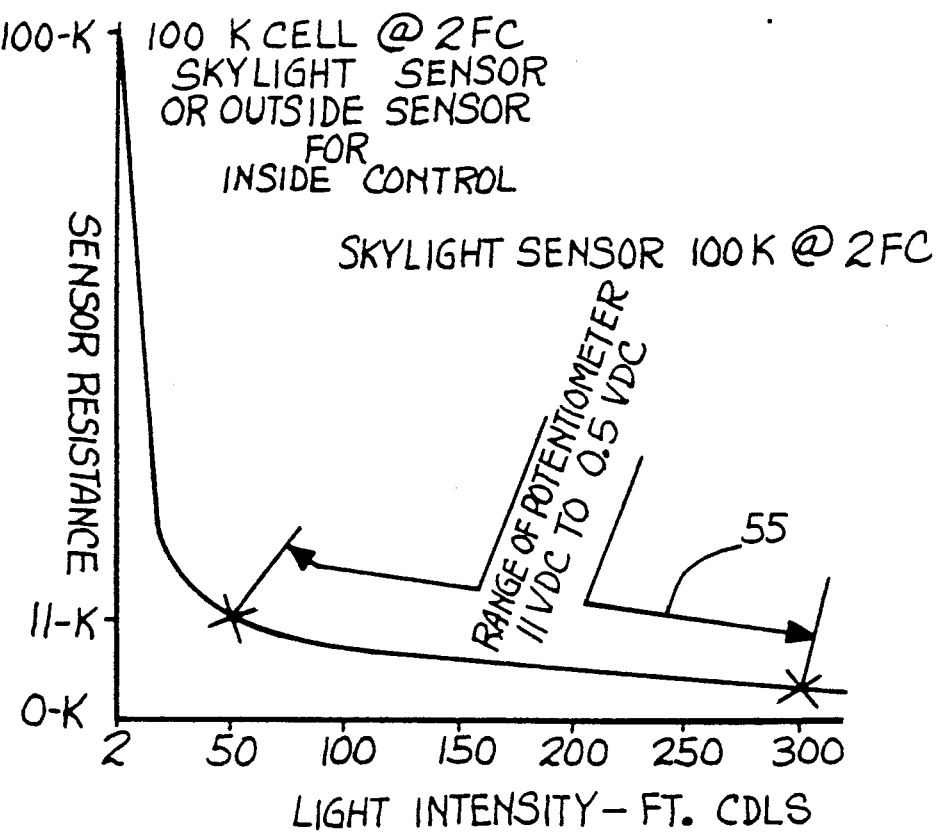
FIG. 18 is a view like FIGS. 14 and 15, but is for a high-resistance photocell.

Referring to FIG. 18, still another type of photoconductive cell which can be easily implemented in the FIG. 1 system is an extremely high resistance cell having 100K resistance at 2 foot candles, 11K at 50 foot candles, and approximately 0.5K at 300 foot candles. In this situation, as with the intermediate resistance cell just discussed, the buffer circuit 34 receives 11 volts DC until the sensor resistance drops to 11K, corresponding to a 50 foot candle input. Thereafter, as shown at 55 in FIG. 18, between the 50 foot candle and 300 foot candle range the voltage to the buffer circuit and consequently to the potentiometer varies approximately linearly between 11 volts and 0.5 volts.

Figures 14, 15:
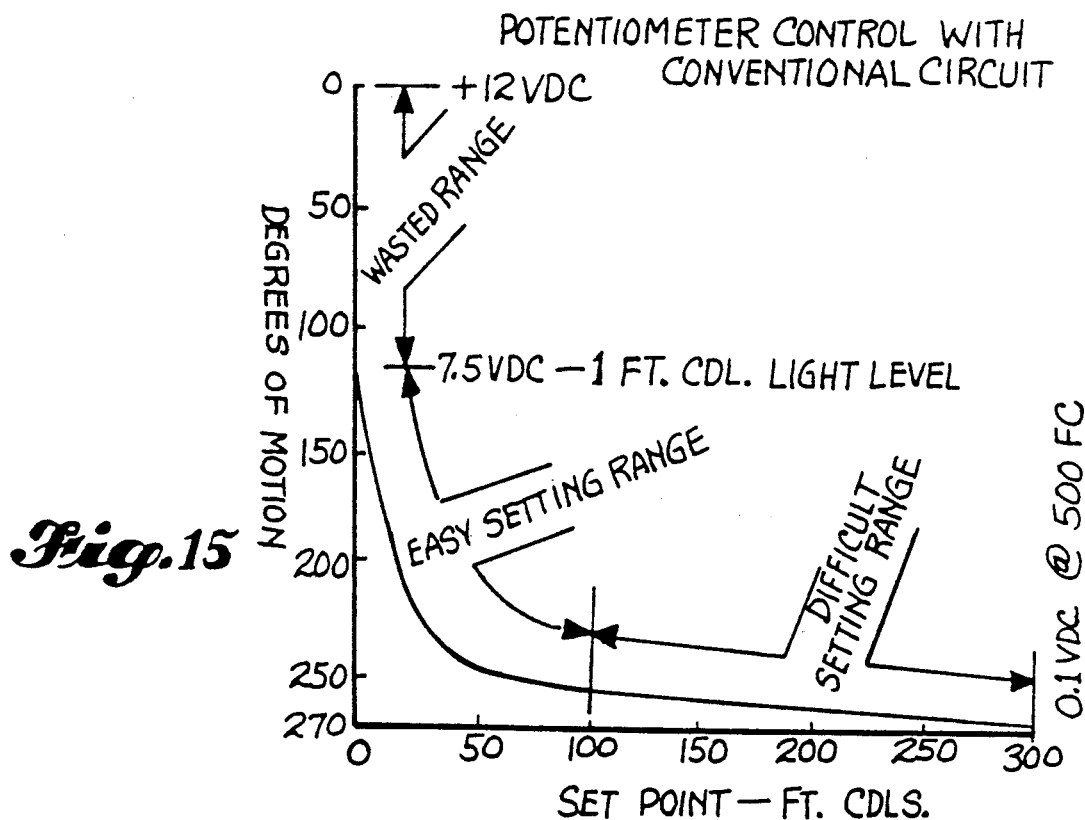
FIG. 14 is a table which illustrates degrees of potentiometer adjustment as a function of voltage input and is applied to potentiometer circuitry shown in FIG. 11.
FIG. 15 is a graph which illustrates degrees of potentiometer adjustment in relation to the set point in foot candles of the prior art circuit shown in FIG. 11.
Figure 16:
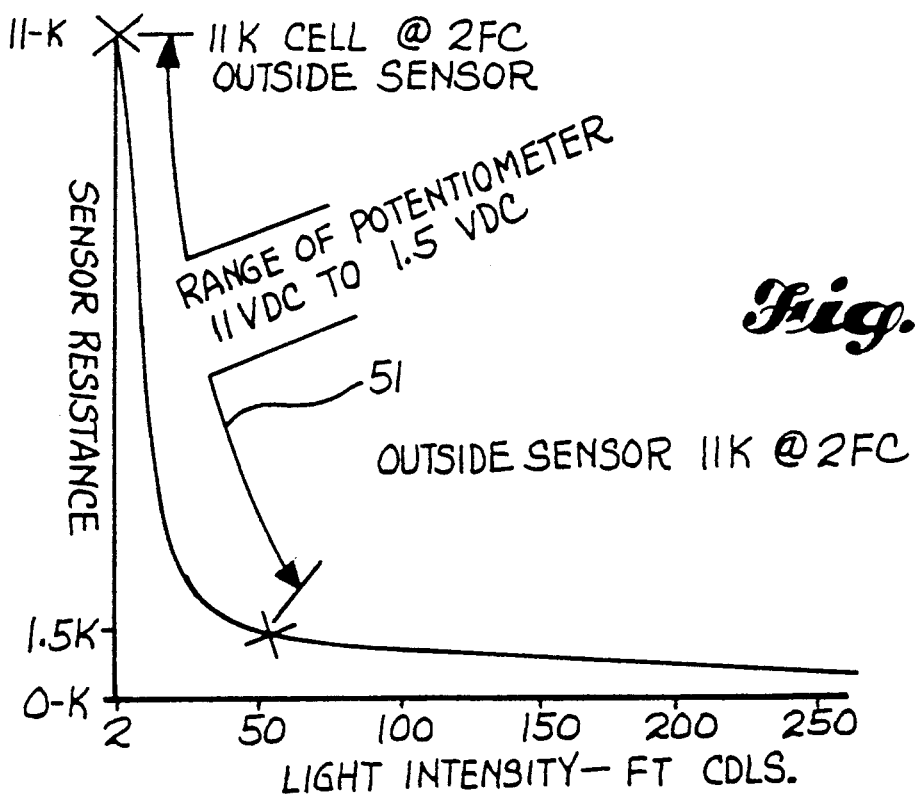
FIG. 16 illustrates the functional results of the invention when a low resistance photoconductive cell is employed in the invention, and shows how the range of potentiometer adjustment is made substantially linearly proportional as photocell resistance changes.

Since it is possible to use different ranges of cell resistances, this permits the invention to be used as follows. First, the user selects the lowest foot candle input which is to be sensed by the system. Then, the user selects a cell having a certain resistance range which may be one of the three types discussed above, wherein the cell's resistance has a certain value at the selected low foot candle input. This resistance is 11K for the examples shown in FIGS. 16–18, which is for a 12 volt system using a 1.0 milliamp constant-current diode. The constant current diode 32 defines the voltage which can be "read" across such cell and defines it in a manner such that it will be within a mostly linear leg of the cell's typical output curve as illustrated in FIGS. 15–17. Therefore, using the constant-current diode system described above makes the output of a photoconductive type sensor closer to being linearly proportional. This is a considerable improvement, especially from the standpoint that it makes potentiometer settings easier to adjust.

Referring now to FIGS. 2 and 3, therein is shown at 18 a preferred housing for the inside ceiling sensor cell 16. The housing has a base portion 48 which flares outwardly from one end of a tubular or cylindrical body portion 50. The body portion 50 defines a chamber 52 in which the sensor 16 is received. Normally, the sensor 16 rests against an inner sidewall 54 of the chamber and receives light from an area forwardly of the sensor through a circular end opening 56 leading into the chamber. As is apparent, this opening 56 is closed by a transparent lens 58. It may be desirable to paint the inner sidewalls 60, 54 of the chamber black in order to reduce or eliminate light reflections off these surfaces. This is not shown in the drawings, however.

The rearward side 62 of the housing provides a flat and circular mounting surface. Attached to this surface 62 is a disk of an adhesive material 64. This material 64 is preferably a foam poly-urethane having an acrylic adhesive on opposite sides 64a, 64b for mounting the housing 18 to a ceiling panel 66.

In actual use, the housing 18 would be supplied with the adhesive 64 already attached to mounting surface 62. The outer side 68 of the adhesive 64 would have a paper backing. Prior to attachment, the backing is pulled off the adhesive so that it can bond the housing 18 directly to the surface of the ceiling panel 66.

The housing 18 further has a tubular stem 70 which projects rearwardly from mounting surface 62. This stem provides a conduit for the photocell's leads 22, 24. The stem 70 extends through a circular hole 71 in the adhesive 64.

FIG. 2 illustrates how the housing 18 is assembled. The sensor 16 and its leads are placed into chamber 52 through chamber opening 56 and the leads 22, 24 are extended rearwardly through tubular stem 70. Thereafter, lens 58 is placed over the photocell in the manner shown in FIG. 3. The housing's base and body portions are made as a single unit.

Figure 12:
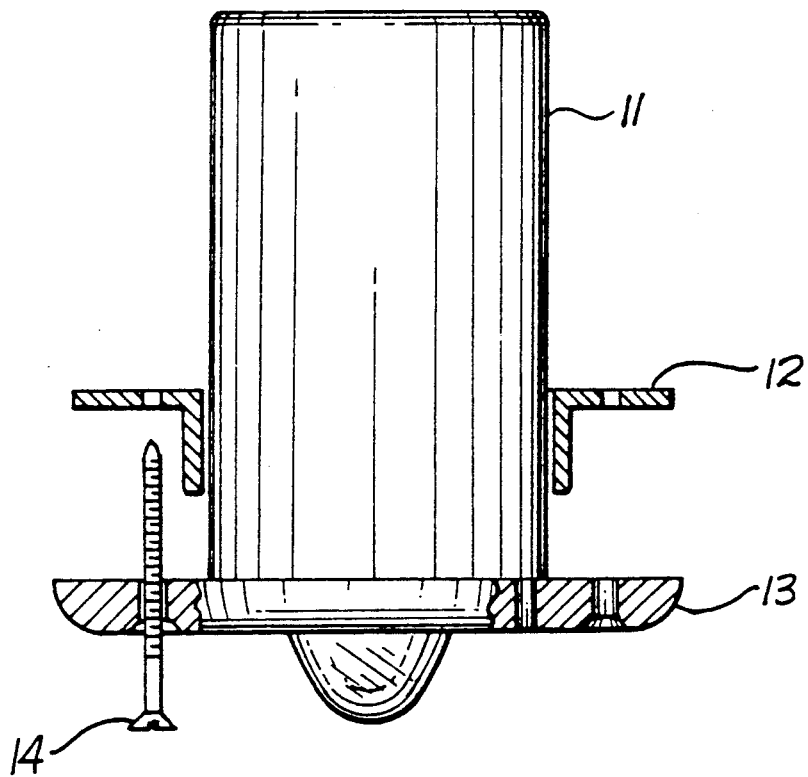
FIG. 12 is a side view labeled "prior art" and shows a conventional sensor housing currently in use.
Figure 13:
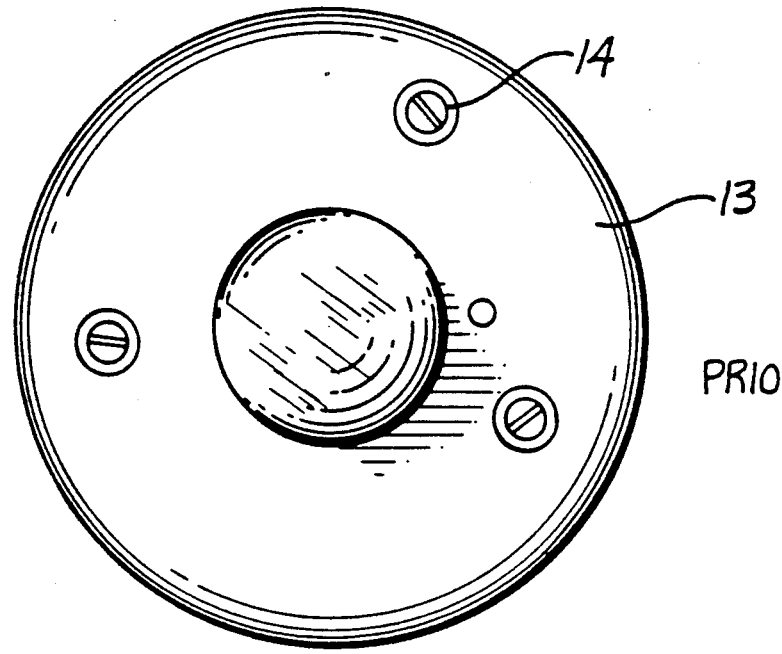
FIG. 13 is a front-end view labeled "prior art" of the sensor housing shown in FIG. 12.

The housing shown in FIGS. 2 and 3, unlike the prior art housings shown in FIGS. 12 and 13, is easily installable. It requires the user to first make a small hole 72 in the ceiling panel which is suitable to accommodate the size of tubular stem 70. The photocell's leads 22, 24 are then connected to the necessary wiring behind the panel, and the housing is then stuck to the panel by adhesive 64. Of course, the paper backing on the adhesive would first be removed. This entire operation can be accomplished in a matter of a few minutes.

Referring now to FIGS. 4–6, therein is shown an alternative embodiment of the housing 18 which is suitable for use in conjunction with a photodiode type sensor. In other words this housing would be a good replacement for the housing shown in U.S. Pat. No. 4,758,767 which is incorporated herein by reference.

Unlike the housing shown in FIGS. 2 and 3, which is made as a single unit where the photocell is installed through the front end of the housing, in the alternative embodiment the electronics are installed rearwardly. For example, the sensor includes a photodiode 72, an operational amplifier 74, and certain other electronic components of the type disclosed in the '767 patent. These are mounted directly to a circular disk or shelf 76. The shelf supports and acts as a circuit board for the components 72, 74. The housing 18 has a rearward, circular end opening 79 that is closed by a circular plug 78. Preferably, the electronics disk 76 is seated within a circular recess 80 of the plug during installation. This configuration is best shown in FIG. 6 where it can be seen that preferably the shelf 76 is sandwiched tightly between plug 78 and an annular shoulder 82.

When the plug 78 is installed, its outer surface 84 is flush with an annular surface 86 that surrounds and defines the outer diameter of circular opening 79. This defines the housing's rearward mounting surface to be the same in configuration as the circular mounting surface 62 of the housing 18 shown in FIGS. 2 and 3. Also, similar to the housing shown in FIGS. 2 and 3, an adhesive material 64 covers these surfaces and is used to mount the housing to ceiling panel 66.

In this alternative embodiment, tubular stem 70 is part of plug 78. In order to ensure a tight fit of plug 78 into the rear of the housing, the plug may have an annular shoulder arrangement 81a, 81b surrounding recess 80 which mates with like structure 83a, 83b inside opening 79 (see FIG. 6).

The type of electronics received in this housing may utilize a gain control potentiometer 88 which is adjustable at the housing. An opening 90 through the wall of body portion 50 provides access to potentiometer 88 and permits the turning of its adjustment screw by a suitable implement 92. Lastly, in this embodiment, the chamber's opening 56 is preferably covered by a Fresnel type lens 94. This lens serves to limit the view angle of the photodiode received in the housing's chamber 52.

Thus, having provided the current best known ways for carrying out the invention, it is to be understood that the embodiments previously described could be altered in certain ways without departing from the overall spirit and scope of the invention. Therefore, the invention is not to be limited by any of the preceding description. Instead, the invention is to be limited only by the patent claim or claims which follow, wherein such claims are to be interpreted in accordance with the well-established doctrines of patent claim interpretation.

What is claimed is:

1. An improved photoconductive light sensor circuit, comprising:
   a photoconductive cell interconnecting a circuit junction and a ground, said photoconductive cell being characterized in that said cell normally has a generally nonlinear electrical resistance that decreases in accordance with exposure of said cell to increasing light levels, and vice versa;
   a constant-current, fixed-voltage power source connected to said circuit junction, and operative to continuously transmit a substantially constant current through said photoconductive cell at all times while said light sensor circuit is both operative and said cell has a resistance substantially at or below a certain selected resistance, said constant current source being further operative to transmit a variable current that is less than the magnitude of said constant current when said cell's resistance is higher than said selected resistance; and
   a voltage-sensing circuit operatively connected to said circuit junction, for sensing the change in voltage at said junction in response to variations of the resistance of said photoconductive cell in response to changes in said cell's light exposure.

2. The invention of claim 1, wherein said circuit junction is positioned in a remote location relative to the location of said photoconductive cell.

3. The invention of claim 1, wherein said voltage-sensing circuit includes:
   a sensor delay circuit having a sensor delay capacitor; and
   a forcing capacitor connected in series to said sensor delay capacitor; and
   a by-pass discharge diode bridging around said forcing capacitor.

4. The invention of claim 3, wherein the capacitance of said forcing capacitor is substantially equal to the capacitance of said sensor delay capacitor.

5. For use in connection with a light sensor having a photoconductive cell, said cell normally having a variable nonlinear electrical resistance that changes in response to changes in light levels impinging on said cell, such resistance decreasing as light levels increase, and vice versa, a method of linearizing the output of said light sensor by making said sensor nonresponsive to light below a certain level, said method comprising:
   selecting a lowest level of desired light sensor sensitivity;
   selecting a photoconductive cell for said light sensor, such cell having a certain normal range of output resistances, and wherein such cell also has a certain desired resistance corresponding to said lowest level of desired light sensor sensitivity, said desired resistance being at the upper end of a substantially linear portion of said cell's nonlinear output response; and
   transmitting a substantially constant current through said selected cell from a fixed-voltage power source at all times while said light sensor is operative, and while said cell's output resistance is substantially at or below said desired resistance, wherein the magnitude of said constant current is selected to have a value such that when said selected cell has said desired resistance, said desired resistance and constant current define a substantially maximum desired voltage across said cell, corresponding to said selected lowest level of desired light sensor sensitivity; and
   transmitting a variable current through said cell from said fixed-voltage power source when said cell's resistance is above said desired resistance, including providing a substantially fixed-voltage drop between said fixed-voltage power source and said cell while said variable current is transmitted through said cell, the magnitude of said fixed-voltage drop being selected so that the difference between the voltage of said fixed-voltage drop and the voltage of said fixed-voltage power source substantially equals said maximum desired voltage across said cell, to limit the voltage across said cell to said maximum desired voltage when said cell's resistance is above said desired resistance, and to thereby make said voltage across said cell substantially nonresponsive to changing light levels that are below said lowest level of desired light sensitivity.

6. The method of claim 5, wherein transmitting a substantially constant current through said photoconductive cell includes
   using a constant-current diode interconnecting in series said fixed-voltage power source and said photoconductive cell.

7. The method of claim 5, wherein
   selecting said lowest level of desired light sensor sensitivity includes selecting 2 foot candles as being the lowest level of sensitivity, and
   selecting said photoconductive cell includes selecting a cell having a normal range of output resistances where cell resistance is approximately 11K ohms at 2 foot candles of light input, and approximately 1.5K ohms at 50 foot candles of input, and said certain desired resistance of said cell at said lowest level of sensitivity is approximately 11K ohms, and
   transmitting a substantially constant current through said selected cell includes using a constant-current diode interconnecting in series a 12 volt DC low voltage power source and said photoconductive cell, said diode being of a type that causes a current of approximately 1.0 milliamps to be transmitted though said cell until the voltage drop across said diode decreases to approximately 1 volt DC, and of a type that maintains a fixed voltage drop of approximately 1 volt DC thereacross when said cell resistance exceeds 11K ohms, and transmits a variable current through said cell so long as said cell resistance exceeds 11K ohms.

8. The method of claim 5, wherein
   selecting said lowest level of desired light sensor sensitivity includes selecting twenty-five foot candles as being the lowest level of sensitivity, and
   selecting said photoconductive cell includes selecting a cell having a normal range of output resistances where cell resistance is approximately 30K ohms at 2 foot candles of light input, and approximately 11K ohms at 25 foot candles of input, and approximately 1K ohms at 150 foot candles of input, and said certain desired resistance of said cell at said lowest level of sensitivity is approximately 11K ohms, and
   transmitting a substantially constant current through said selected cell includes using a constant-current diode interconnecting in series a 12 volt DC low voltage power source and said photoconductive cell, said diode being of a type that causes a current of approximately 1.0 milliamps to be transmitted through said cell until the voltage drop across said diode decreases to approximately 1 volt DC, and of a type that maintains a fixed voltage drop of approximately 1 volt DC thereacross when said cell resistance exceeds 11K ohms, and transmits a variable current through said cell so long as said cell resistance exceeds 11K ohms.

9. The method of claim 5, wherein
selecting said lowest level of desired light sensor sensitivity includes selecting fifty foot candles as being the lowest level of sensitivity, and
selecting said photoconductive cell includes selecting a cell having a normal range of output resistances where cell resistance is approximately 100K ohms at 2 foot candles of light input, and approximately 11K ohms at 50 foot candles of input, and approximately 0.5K ohms at 300 foot candles of input, and said certain desired resistance of said cell at said lowest level of sensitivity is approximately 11K ohms, and
transmitting a substantially constant current through said selected cell includes using a constant-current diode interconnecting in series a 12 volt DC low voltage power source and said photoconductive cell, said diode being of a type that causes a current of approximately 1.0 milliamps to be transmitted through said cell until the voltage drop across said diode decreases to approximately 1 volt DC, and of a type that maintains a fixed voltage drop of approximately 1 volt DC thereacross when said cell resistance exceeds 11K ohms, and transmits a variable current through said cell so long as said cell resistance exceeds 11K ohms.

10. The invention of claim 1, wherein said constant-current, fixed-voltage power source includes a constant-current diode interconnecting a fixed-voltage power source and said circuit junction.

11. An improved photoconductive light sensor, comprising:
a photoconductive cell characterized in that said cell normally has a variable, generally nonlinear electrical resistance that decreases in accordance with increasing exposure of said cell to changing light levels, and having a certain desired resistance when a certain threshold level of light impinges on said cell; and a constant-current power source connected to said photoconductive cell, said constant-current power source including an electric circuit element serially interconnecting said photoconductive cell and a power supply of a fixed voltage, said electric circuit element being characterized in that it is operable to transmit a substantially constant current of a certain magnitude from said fixed voltage power supply through said photoconductive cell at all times when said sensor is in operation, and when said cell has a resistance that is substantially at or below said certain desired resistance, said constant current defining the magnitude of the voltage across said cell, such voltage changing as said cell is exposed to changing light levels, said electric circuit element being further operable to maintain a substantially constant voltage drop thereacross when said cell's resistance is greater than said desired resistance, and to transmit a variable current from said power supply through said cell when said cell's resistance is greater than said desired resistance, and wherein the sum of the voltage across said photoconductive cell and the voltage drop across said electric circuit element substantially equals the voltage of said power supply, thereby making the voltage across said cell substantially constant and nonresponsive when cell resistance is greater than said desired resistance, to correspondingly make the voltage across said cell substantially nonresponsive to light levels below said threshold level; and a voltage-sensing circuit operative to sense the change in voltage across said photoconductive cell in response to changes in said cell's exposure to light levels.

* * * * *